United States Patent
Filippov et al.

(10) Patent No.: US 12,320,254 B2
(45) Date of Patent: Jun. 3, 2025

(54) SELF-ADAPTING DIGITAL TWINS

(71) Applicant: Landmark Graphics Corporation, Houston, TX (US)

(72) Inventors: Andrey Filippov, Houston, TX (US); Egidio Marotta, Houston, TX (US); Dale McMullin, Trophy Club, TX (US); Vitaly Khoriakov, Calgary (CA)

(73) Assignee: Landmark Graphics Corporation, Houston, TX (US)

( * ) Notice: Subject to any disclaimer, the term of this patent is extended or adjusted under 35 U.S.C. 154(b) by 938 days.

(21) Appl. No.: 16/764,240

(22) PCT Filed: May 15, 2019

(86) PCT No.: PCT/US2019/032493
§ 371 (c)(1),
(2) Date: May 14, 2020

(87) PCT Pub. No.: WO2020/231428
PCT Pub. Date: Nov. 19, 2020

(65) Prior Publication Data
US 2021/0404328 A1 Dec. 30, 2021

(51) Int. Cl.
*E21B 49/00* (2006.01)
*G06F 30/20* (2020.01)

(52) U.S. Cl.
CPC ............ *E21B 49/003* (2013.01); *G06F 30/20* (2020.01); *E21B 2200/20* (2020.05)

(58) Field of Classification Search
CPC .... E21B 49/003; E21B 2200/20; E21B 44/00; E21B 43/00; E21B 41/00; G06F 30/20; G07C 3/00
See application file for complete search history.

(56) References Cited

U.S. PATENT DOCUMENTS 9,175,557 B2 * 11/2015 Iversen .................. E21B 44/00
2003/0168257 A1 9/2003 Aldred et al.
(Continued)

OTHER PUBLICATIONS

Nygaard et al. Evaluating Nonlinear Kalman Filters for Parameters Estimation in Reservoirs During Petroleum Well Drilling, 2006, IEEE, pp. 1777-1782 (Year: 2006).*
(Continued)

*Primary Examiner* — Ryan F Pitaro
*Assistant Examiner* — Bernard E Cothran
(74) *Attorney, Agent, or Firm* — Kilpatrick Townsend & Stockton, LLP (57) ABSTRACT

A system and method can be used for implementing self-adapting digital twins. The system may include operations for estimate a state matrix characterizing behavior of a hydrocarbon recovery process implemented by a hydrocarbon recovery tool. Observed values of one or more sensors for at least one process parameter may be obtained from sensors deployed throughout the drilling environment. These sensors may be physical sensors acquiring information about physical changes within the drilling environment; and processes monitoring output of system functions and/or other processes. A data assimilation tool may be applied to the estimated state matrix and the observed values to produce an updated state matrix. The updated state matrix may be used as the previous state matrix in a subsequent time step, thus implementing a self-adapting digital twin model.

20 Claims, 6 Drawing Sheets

(56) References Cited

U.S. PATENT DOCUMENTS

| | | | |
|---|---|---|---|
| 2004/0134686 A1* | 7/2004 | Burrows | E21B 44/00 |
| | | | 175/45 |
| 2009/0166033 A1 | 7/2009 | Brouwer et al. | |
| 2014/0039793 A1 | 2/2014 | Querales et al. | |
| 2018/0016875 A1 | 1/2018 | Shokanov et al. | |
| 2019/0137983 A1 | 5/2019 | Subramaniyan et al. | |
| 2021/0254448 A1* | 8/2021 | Phillips | E21B 44/02 |

OTHER PUBLICATIONS

Mayani et al., Drilling Automated Realtime Monitoring Using Digital Twin, Nov. 2018, Society of Petroleum Engineers, pp. 1-11 (Year: 2018).*

Reynolds et al., Iterative Ensemble Kalman Filters for Data Assimilation, Sep. 2009, ResearchGate, pp. 1-10 (Year: 2009).*

Aanonsen et al., "The Ensemble Kalman Filter in Reservoir Engineering—a Review", Society of Petroleum Engineers, SPE 117274, vol. 14, No. 3, Sep. 2009, pp. 393-412.

Filippov et al., "Fast Economic Analysis and Optimization of Fracture—Stimulated Wells in Condensate Reservoirs", SPE/IAEE Hydrocarbon Economics and Evaluation Symposium, SPE-179957-MS, 2016, 8 pages.

Marotta et al., "The Hybrid Twin—Coupling Physics and Data-Driven Digital Twins", Energy White Paper, Halliburton, 2018, 10 pages.

International Application No. PCT/US2019/032493, "International Search Report and Written Opinion", Feb. 6, 2020, 9 pages.

* cited by examiner

SELF-ADAPTING DIGITAL TWINS

TECHNICAL FIELD

The present disclosure relates generally to optimizing the performance of hydrocarbon recovery tools. More specifically, but not by way of limitation, this disclosure relates to the implementation of self-adapting digital twins for one or more hydrocarbon recovery processes implemented on one or more hydrocarbon recovery tools and/or their respective components or component processes to enable error detection.

BACKGROUND

A digital twin is a representative digital replica of physical assets, processes, and systems. Digital twins have been proven useful in several industries, including aerospace, renewable energy and transportation. Benefits captured across these industries include improved quality and speed of decision-making, greater asset utilization, condition-based monitoring and prognostication, enhanced operational-efficiency, and improvements in preventive maintenance. Meanwhile, the concept of developing and applying digital twin-based solutions is slowly, but steadily expanding to other industries, including Oil and Gas industry.

A number of factors make digital twin implementation difficult within energy sector assets. For example, the complexity and scale of physical assets and the difficulty in reducing component parts and processes of physical assets to a set that can be easily modeled though numerical analysis. Implementing conventional digital twin techniques on the complex physical assets common in the energy sector would be inefficient and resource intensive.

DETAILED DESCRIPTION

Certain aspects and features relate to a system that improves, and makes more efficient, the prediction of an optimized value for a process parameter using a self-adapting digital twins (DT). A DT can be a mathematical or numerical representation of a hydrocarbon recovery process or environment as implemented or affected by one or more hydrocarbon recovery tools. A DT model can be updated iteratively at time steps to produce observation-based corrections to the model parameters and information regarding the controllable process environment. The aspects described in the present can be applied to various stages of hydrocarbon recovery, including drilling and production.

There are several obstacles to DT implementation in the energy sector. A first obstacle is that the complexity and multi-scale character of drilling processes and production of hydrocarbons, both in the reservoir and wellbore, result in significant complexity of corresponding mathematical and numerical models, making realizations of DT simulations numerically expensive for real-time applications.

The second obstacle is the spatial and temporal variation of hydrocarbon recovery parameters related, for example, to depletion of pressure and changing properties of reservoir. Thus, it may be necessary to update parameters of the DTs based on multiple channels of sensor data, which may have accuracy that varies with time.

A self-adapting DT may be generated using a steady-state DT by adding the sensor inputs and organizing the DT updating process based on minimization of the difference between the values of sensor output (i.e., observed process parameters) and prediction of the DT model. DT, as a comprehensive representative model of real processes, contains a number of parameters, including those that may be of particular interest to engineers, as these values indicate the health of a hydrocarbon recovery tool, field of hydrocarbon recovery tools, process, or the overall drilling or production environment, such as the reservoir depletion, well bore geometry change, actual permeability of fractures, flow rates, overall site production and the like. Hydrocarbon recovery tools may include drilling tools and production tools including the physical components and components of assets within the hydrocarbon recovery environment.

The observed process parameters, which are also DT parameters, may be those for which sensor output or direct process monitoring can be obtained. These process parameters may have directly or indirectly observable values at any given time step. Historical values for the observed process parameters and DT parameters may be used to evaluate best guesses for DT parameters at the beginning of the DT sensor data-based updating processes.

Various numerical regression techniques may be used to identify the DT parameters that yield the minimal difference between the observed and predicted physical parameters. Iterative application of these techniques can result in a self-adapting DT that provides a comprehensive representation of the real process such as drilling.

Once the DT model and the corresponding parameter-regression algorithm are built, they can be used to monitor changes to DT parameters associated with a hydrocarbon recovery tool and also for the optimization of operations of the hydrocarbon recovery process. In this case, the regression methods can be used to minimize a process target function, such as the process time, total cost of the process etc.

Certain aspects and features of the present disclosure relate to the implementation of self-adapting DTs of a hydrocarbon recovery process implemented on one or more hydrocarbon recovery tools. Aspects may estimate a state matrix characterizing behavior of a hydrocarbon recovery process implemented on one or more hydrocarbon recovery tools such as a physical drilling apparatus or production apparatus, a group of physical apparati, using a DT of the hydrocarbon recovery process as applied to a previous state matrix. Observed values of one or more sensors for at least one process parameter may be obtained from sensors deployed throughout the hydrocarbon recovery environment (e.g., a wellbore or fracture network). These sensors may be physical sensors acquiring information about physical changes within the hydrocarbon recovery environment. The sensors may also be processes monitoring output of system functions and/or other processes. A data assimilation tool such as an Ensemble Kalman Filter (EnKF), may be applied to update the DT parameters (which are part of the state matrix) and the observed values of the process parameters to produce an updated state matrix. The updated state matrix may be used as the previous state matrix in a subsequent time step, thus implementing a self-adapting DT model.

Certain aspects and features of the present disclosure may use the self-adapting DT to identify the hydrocarbon recovery operations that are not performing optimally. Similarly, the self-adapting DT may be used to detect an impending catastrophic failure that requires engineer intervention. Thus, the operations of components of a hydrocarbon recovery tool may be tweaked or modified without human intervention, unless a catastrophic failure even tis predict to occur.

For example, a computing device implementing the self-adapting DT of a hydrocarbon recovery process can determine, based on the updated state matrix, whether operations of one or more components of the hydrocarbon recovery tool implementing the hydrocarbon recovery process should be altered to affect a DT parameter. For example, an estimate of a DT parameter within the updated state matrix may be compared to an expected value or range for the DT parameter, which may be an operational range for the DT parameter. If the estimated DT parameter value falls within a predetermined acceptable range, the hydrocarbon recovery tool may be permitted to continue operating without modification. However, if the estimated DT parameter value falls outside of the acceptable range, then the computing device can initiate a change in operations of the hydrocarbon recovery tool. Observed values of sensor output may provide an indication as to which parameters correlated to the DT parameter require attention or adjust. The operations of hydrocarbon recovery tool components that impact or affect these observed values can then be adjusted to increase or decrease the observed values and bring estimates of the DT parameter within acceptable ranges.

In certain aspects, if the estimated DT parameter value exceeds a threshold, and is sufficiently far outside of the acceptable range, this can be an indication that a catastrophic failure event may be occurring or likely to occur. An alert message can be generated and provided to an engineer or attendant of the hydrocarbon recovery tool. The alert message may be displayed on a screen of an edge device collocated with the hydrocarbon recovery tool, transmitted to a remote computing device such as a remote monitoring station or an edge device of another hydrocarbon recovery tool within a field. The alert message may take the form of an auditory alert initiated within the hydrocarbon recovery tool environment or a remote monitoring location.

Using some examples of the present disclosure can result in rapid analysis of the health and efficacy of the hydrocarbon recovery process environment and hardware. Some examples of the present disclosure accurately and robustly predict changes in DT parameters the correlate to health and efficiency of the hydrocarbon recovery tool. If done manually, by an engineer or attendant, such monitoring would require around the clock visual analysis of a number of DT parameters, some of which may be the result of monitored digital processes and therefore not easily trackable. Certain aspects enable rapid detection of operational problems and rapid adjustment or modification of corresponding hydrocarbon recovery tool components.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative aspects but, like the illustrative aspects, should not be used to limit the present disclosure.

Figure 1:
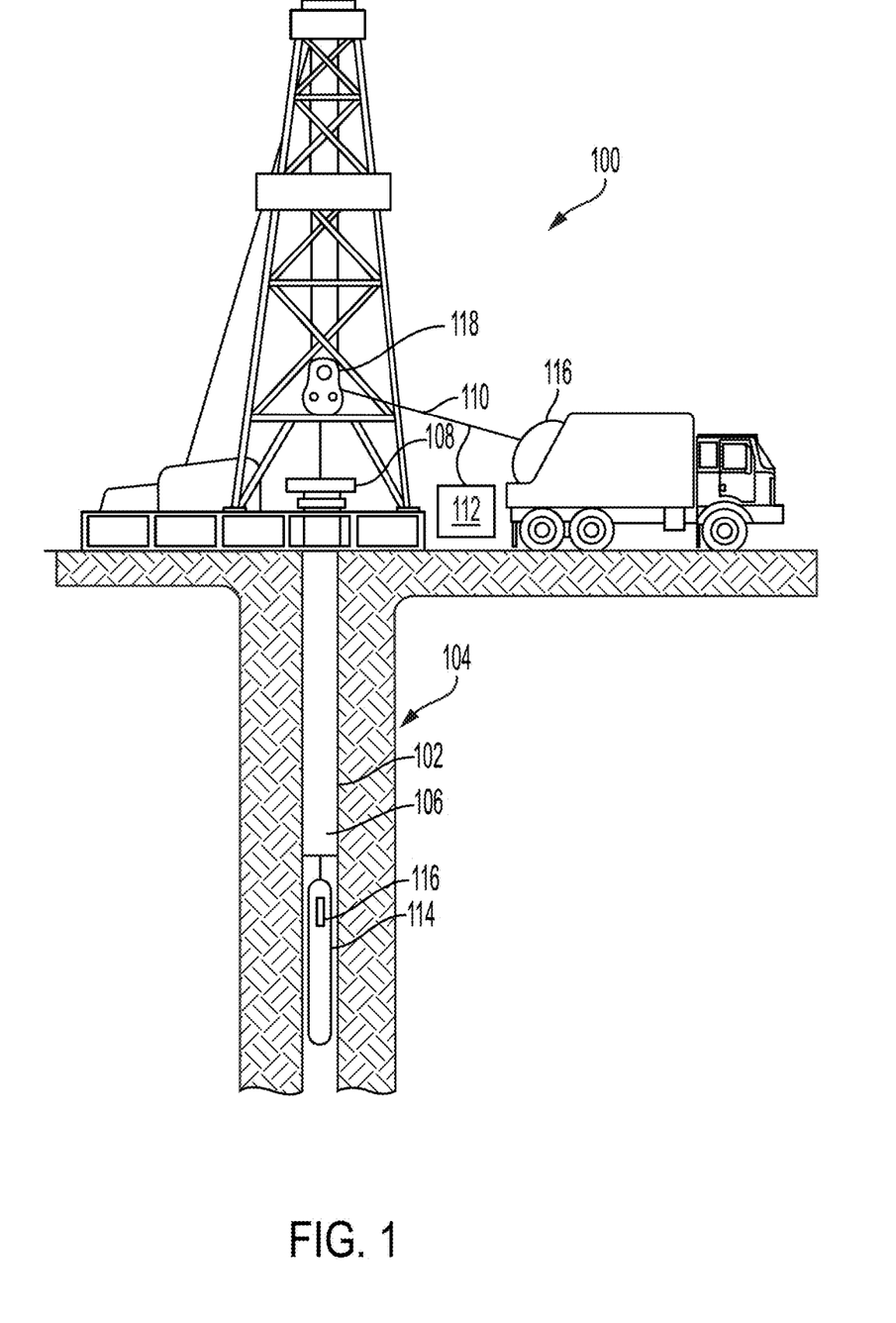
FIG. 1 is a cross-sectional view of an example of a well system that includes a system for implementing a hydrocarbon recovery process according to some aspects.

FIG. 1 is a cross-sectional side view of an example of a hydrocarbon recovery tool as a well system 100 according to some aspects. The well system 100 includes a wellbore 102 extending through a hydrocarbon bearing subterranean formation 104. In this example, the wellbore 102 is vertical, but in other examples the wellbore 102 can additionally or alternatively be horizontal or deviated.

In this example, the wellbore 102 includes a casing string 106 (e.g., a metal casing) extending from the well surface 108 into the subterranean formation 104. The casing string 106 can provide a conduit via which formation fluids, such as production fluids produced from the subterranean formation 104, can travel from the wellbore 102 to the well surface 108. In other examples, the wellbore 102 can lack the casing string 106.

The wellbore 102 can include a well tool 114 for performing one or more tasks in the wellbore 102. Examples of the well tool 114 can include a safety tool, valve tool, packer tool, monitoring tool, formation testing tool, a logging while hydrocarbon recovery tool, or any combination of these. In some examples, the well tool 114 is deployed in the wellbore 102 using a wireline 110, slickline, or coiled tube, which can be wrapped around a winch 118 or pulley at the well surface 108.

The well system 100 can also include a computing device 112. The computing device 112 can be positioned at the well surface 108 or elsewhere (e.g., offsite). The computing device 112 may be in communication with the well tool 114, a camera, one or more sensors, or another electronic device for gathering information from which a schematic of the wellbore can be produced. For example, the computing device 112 can have a communication interface for transmitting information to and receiving information from another communication interface 116 of the well tool 114.

In some examples, the computing device 112 can receive information from downhole (or elsewhere) in substantially real time, which can be referred to as real-time data. The real-time data can include information related to the well system 100. For example, the well tool 114 can stream real-time data to the computing device 112, where the real-time data includes information about the formation or location of the well tool 114 in the wellbore 102.

Figure 2:
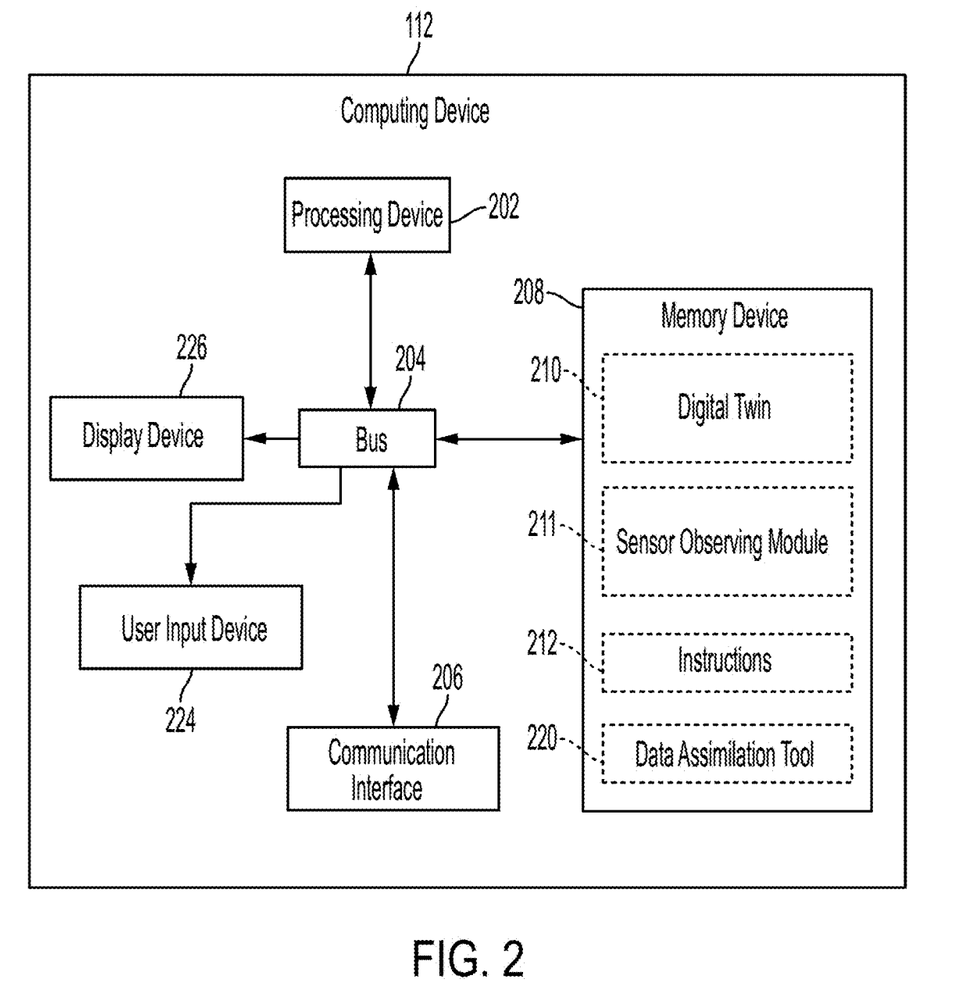
FIG. 2 is block diagram of a computing device for implementing a hydrocarbon recovery process on a hydrocarbon recovery tool according to some aspects.

FIG. 2 depicts an example of a computing device 112. The computing device 112 may be an edge device located on or near a hydrocarbon recovery tool, or in IoT or network asset models, the computing device 112 may be a computing device in the Cloud. The computing device 112 can include a processing device 202, a bus 204, a communication interface 206, a memory device 208, a user input device 224, and a display device 226. In some examples, some or all of the components shown in FIG. 2 can be integrated into a single structure, such as a single housing. In other examples, some or all of the components shown in FIG. 2 can be distributed (e.g., in separate housings) and in communication with each other.

The processing device 202 can execute one or more operations for generating self-adapting DT and using the DTs to optimize control of a wellbore operation. The processing device 202 can execute instructions stored in the memory device 208 to perform the operations. The processing device 202 can include one processing device or multiple processing devices. Non-limiting examples of the processing device 202 include a field-programmable gate array ("FPGA"), an application-specific integrated circuit ("ASIC"), a microprocessing device, etc.

The processing device 202 can be communicatively coupled to the memory device 208 via the bus 204. The non-volatile memory device 208 may include any type of memory device that retains stored information when powered off. Non-limiting examples of the memory device 208 include electrically erasable and programmable read-only memory ("EEPROM"), flash memory, or any other type of non-volatile memory. In some examples, at least some of the memory device 208 can include a non-transitory computer-readable medium from which the processing device 202 can read instructions. A computer-readable medium can include electronic, optical, magnetic, or other storage devices capable of providing the processing device 202 with computer-readable instructions or other program code. Non-limiting examples of a computer-readable medium include (but are not limited to) magnetic disk(s), memory chip(s), read-only memory (ROM), random-access memory ("RAM"), an ASIC, a configured processing device, optical storage, or any other medium from which a computer processing device can read instructions. The instructions can include processing device-specific instructions generated by a compiler or an interpreter from code written in any suitable computer-programming language, including, for example, C, C++, C#, etc.

In this example, the memory device 208 includes at least one DT 210. The memory device 208 in this example also includes a sensor observing model 211 to sample sensor data obtained from sensors deployed within the drilling environment that can be accessed and used to continuously determine, evaluate, and learn parameters associated with the DT 210. In this example, the memory device 208 includes computer program code instructions 212 for acquiring data from sensors within the drilling environment and controlling the well tool 114. The memory device 208 in this example includes a filter 220. The filter can be, for example, computer program code instructions to implement a filtering algorithm and produce optimum values for DT parameters of the DT. Results from the filter can be stored as an updated DT, which may replace the DT 210 in the memory device 208.

In some examples, the computing device 112 includes a communication interface 206. The communication interface 206 can represent one or more components that facilitate a network connection or otherwise facilitate communication between electronic devices. Examples include, but are not limited to, wired interfaces such as Ethernet, USB, IEEE 1394, and/or wireless interfaces such as IEEE 802.11, Bluetooth, near-field communication (NFC) interfaces, RFID interfaces, or radio interfaces for accessing cellular telephone networks (e.g., transceiver/antenna for accessing a CDMA, GSM, UMTS, or other mobile communications network).

In some examples, the computing device 112 includes a user input device 224. The user input device 224 can represent one or more components used to input data. Examples of the user input device 224 can include a keyboard, mouse, touchpad, button, or touch-screen display, etc.

In some examples, the computing device 112 includes a display device 226. The display device 226 can represent one or more components used to output data. Examples of the display device 226 can include a liquid-crystal display (LCD), a television, a computer monitor, a touch-screen display, etc. In some examples, the user input device 224 and the display device 226 can be a single device, such as a touch-screen display.

Figure 3A:
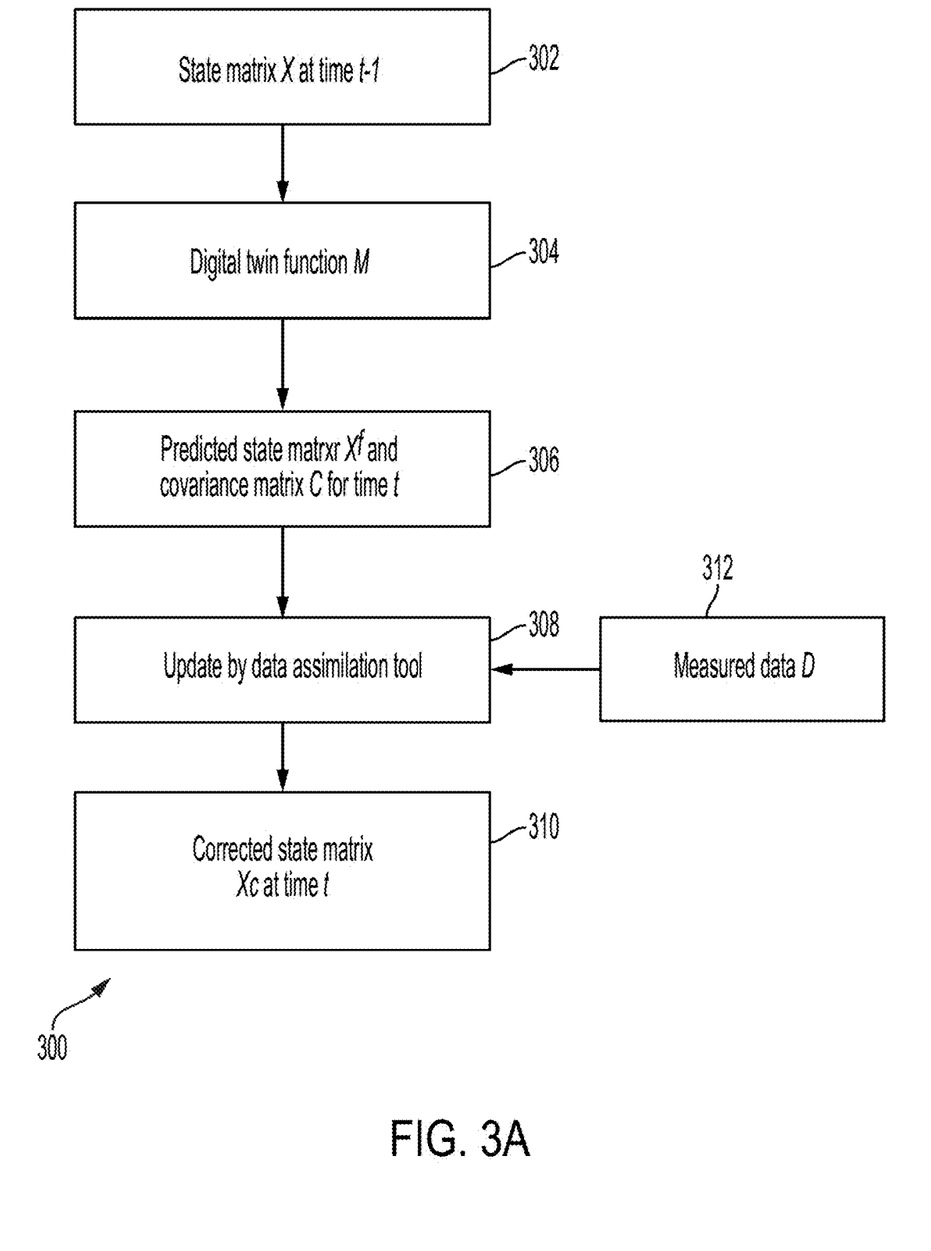
FIG. 3A is a flowchart illustrating a process for implementing a self-adapting digital twin according some aspects.
Figure 3B:
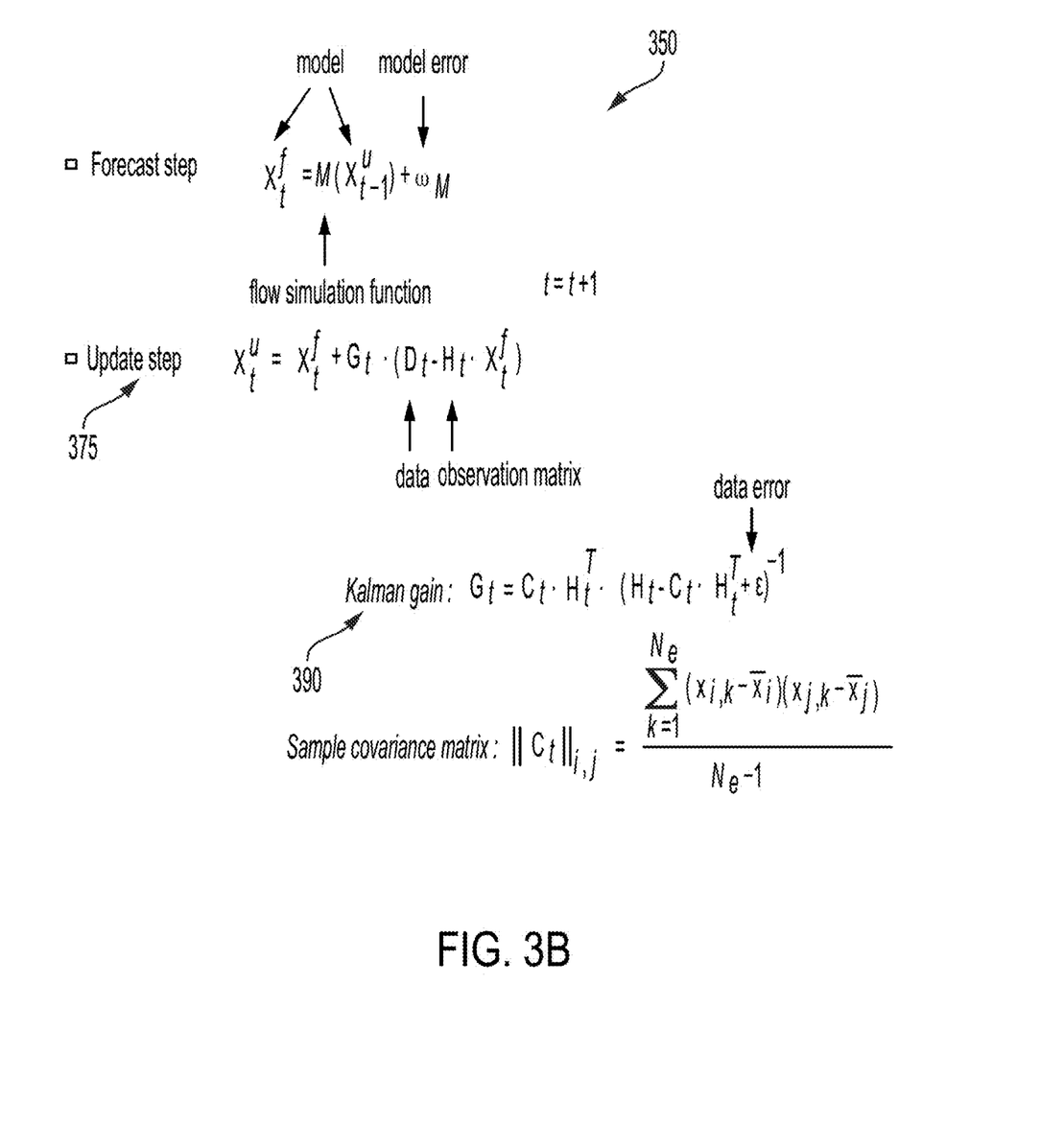
FIG. 3B is a function listing illustrating a process for implementing a self-adapting digital twin according some aspects.

FIGS. A and 3B are a flowchart and accompanying function listing illustrating an example process 300 for implementing a self-adapting DT of a hydrocarbon recovery process implemented on one or more hydrocarbon recovery tools according some aspects. The process 300 is carried out in some aspects by computer program instructions 212. At block 302 of process 300, computing device 112 may generate a state vector $X^1_{t-1}$, which includes unknown DT parameters. These DT parameters may not change often. For example, reservoir permeability, or fracture dimensions may be considered constant for certain fast processes, but their variations needs to be taken into account on longer time scale and they need to be considered transient parameters, which need to be regularly updated. The state vector $X^1_t$ may indicate an actual value of these process parameters at a time t−1, the time step before the current timestamp t.

The process parameters of the state vector $X^1_{t-1}$ may be based on a set of observations represented by a vector $X^2_{t-1}$ that can be predictions of measureable process parameters such as flow rates, temperatures, and pressures in a reservoir or wellbore. The X vectors are time dependent and thus a state vector of the DT at a time t may be represented by the function $X_t = \{X^1_t, X^2_t\}$. The processing device 202 may determine the current state vector for time t using the combination of DT parameters or expected outputs and observed sensor values of process parameters.

At block 304, processing device 202 of computing device 112 apply a DT function M to a set of N realizations of the state vector $X_{t-1}$ (i.e., the state vector a the time step prior to the current time step t). In some aspects, the DT function is a mathematical model characterizing a relationship between the observed process parameters and the DT parameters. In this way, the DT is a representation of a hydrocarbon recovery process, component operation, or field operation associated with the hydrocarbon recovery tool. At the initial time step t=1, the N realizations of the state vector can be chosen randomly distributed around estimated values of the state vector based, for example, on field measurements or geophysical observations.

At block 306, processing device 202 of the computing device 112 can predict an estimated future state vector $X^f_t$ and a covariance matrix C. The future state vector $X^f_t$ may be result of applying the DT function M to the N realizations of the state vector $X_{t-1}$. This prediction may be accomplished using the prediction function 350 illustrated in FIG. 3B.

In block 312, computing device 112, using processing device 202 may collect observed process parameters for the current time step t. For example, the processing device may receive input from sensors deployed throughout the drilling environment. These sensors may provide feedback such as: pump output, voltage and current or frequency of a motor of an ESP, pressure in a reservoir, fracture, or wellbore, flow rate within the reservoir, fracture or well bore, temperate, permeability parameters, chemical and physical parameters, geometry, and input pH. These process parameters may be included in observation matrix H. The processing device may similarly receive any updates to the DT parameters, e.g., output correlating to observed process parameters. The DT parameters may be included in a data matrix D.

At block 308, computing device 112, using processing device can execute a data assimilation tool on the predicted future state vector $X^f_t$. The data assimilation tool can be a filter function gain G applied to the future state vector $X^f_t$, the data matrix D, and the observation matrix H. The update function 375 illustrated in FIG. 3B may characterize the execution of data assimilation using the Ensemble Kalman Filter algorithm. The result of executing the EnKF is the generation of an updated state vector $X^u_t$ by the processing device 202 in block 310.

The operations illustrated in FIGS. A and 3B repeat at the next time step t+1. The time steps are not necessarily equidistant and can be defined by the moments of obtaining the DT parameters of data matrix Dt, whose accuracy and dimension can vary with time. This allows significant flexibility of the EnKF in adaptation of the DT to transient environment.

Figure 4:
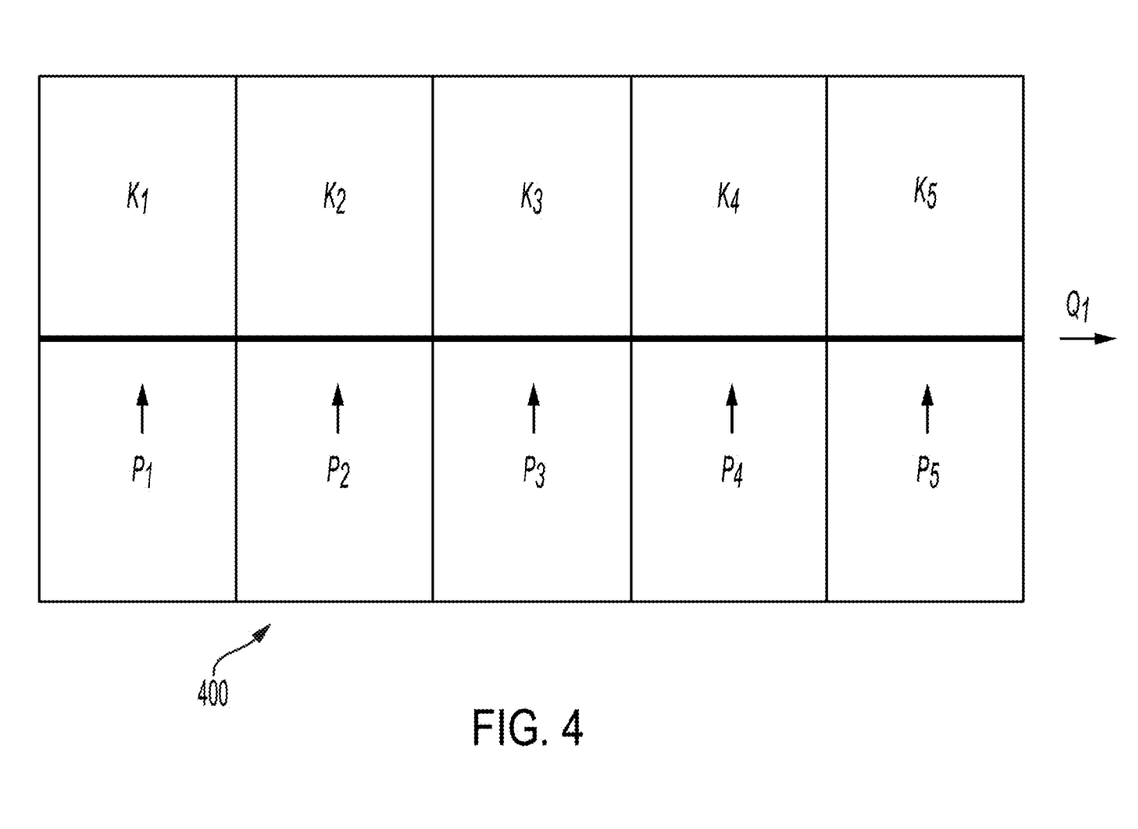
FIG. 4 is a graphical representation of a model fracture network with sensor data parameters corresponding to digital twins according to some aspects.

FIG. 4 is a graphical representation of a model fracture network 400 with a well and four equidistant identical fractures. In the model fracture network 400, the fluid asset may be natural gas, in an initial homogeneous isobaric state. A processing device 202 of the computing device 112 can build a DT of the model fracture network based on data obtained from sensors distributed throughout the reservoir.

A DT of the model fracture network 400 can be a numerical function based on a fracture production model. The model fracture network is characterized by Nk=5 values of average absolute fracture permeability K for ki (i=1, . . . 5). That is, there are five regions of the well separated by four fractures and having 5 different values of absolute fracture permeability K. The absolute fracture permeability is the DT parameter that will be included in a state vector or state matrix $\underline{X}^u_t$, but not in the data matrix $\underline{D}$ representing observed process parameters.

The observed (e.g., measured) process parameters at each time step t, can be five values of pressure P at midpoints between two neighboring fractures indicated by arrows, and the total production rate Qt and production rate from the first fracture Q1. These observed process parameters are estimated at each time step and added to the data matrix $\underline{D}$. Therefore, the total number of process parameters in the model is Nd=12, $K_{1-5}$, $P_{9-5}$, $Q_1$, and $Q_t$.

At each time step, a number of realizations Nr of process parameters are estimated or observed. Thus an augmented state matrix $\underline{X}^u_t$, has dimensions Nd×Nr, while the measurement data matrix $\underline{D}t$ has dimensions (Nd−Nk)×Nr. These matrices cam have the following form: a j-th column of matrix $\underline{X}^u_t$ corresponds to a step of numerical simulation with permeabilities vkij|| with i=1, . . . 5. The columns of the measurement matrix $\underline{D}t$ are identical. In the illustrated example, the observed process parameters are synthesized by running simulations. The simulations may use the same DT model with a pre-set vector of "true" permeabilities and adding 2% of random noise to obtained values of pressures P and production rates Q. At the initial step t=0 the seed permeabilities ||kij|| were chosen randomly with the mean value equal to some characteristic absolute permeabilities. At each time step, the matrix ||kij|| is updated.

Convergence of the algorithm is illustrated in Table 1, where the first, "0", column represents the initial (seed) zonal permeabilities and each of columns 1-7 represents an estimate of the permeability at subsequent time steps. A first approximation of zonal permeabilities to their "true" values (last column) is obtained already during the prediction made during the first step (t=1). With each new time step, the predicted permeability K may move closer to the "true" value. This illustrates fast convergence typical for an Ensemble Kalman Filter. This property allows using the Ensemble Kalman Filter in situations, in which the process parameters are changing rapidly. For example, such a situation can may occur, when the permeabilities change due to the change of rock porosity caused by reservoir depletion.

TABLE 1

| t  | 0     | 1     | 2     | 3     | 4     | 5     | 6     | 7     | "true" |
|----|-------|-------|-------|-------|-------|-------|-------|-------|--------|
| k1 | 1.142 | 1.029 | 1.039 | 1.007 | 1.039 | 1.057 | 1.031 | 1.038 | 0.963  |
| k2 | 1.071 | 0.909 | 0.806 | 0.874 | 0.836 | 0.774 | 0.870 | 0.838 | 0.830  |
| k3 | 1.287 | 0.751 | 0.741 | 0.779 | 0.744 | 0.661 | 0.785 | 0.735 | 0.761  |
| k4 | 1.406 | 2.778 | 2.643 | 2.740 | 2.712 | 2.586 | 2.790 | 2.723 | 2.440  |
| k5 | 1.222 | 0.816 | 0.868 | 0.875 | 0.858 | 0.809 | 0.880 | 0.852 | 0.833  |

Figure 5:
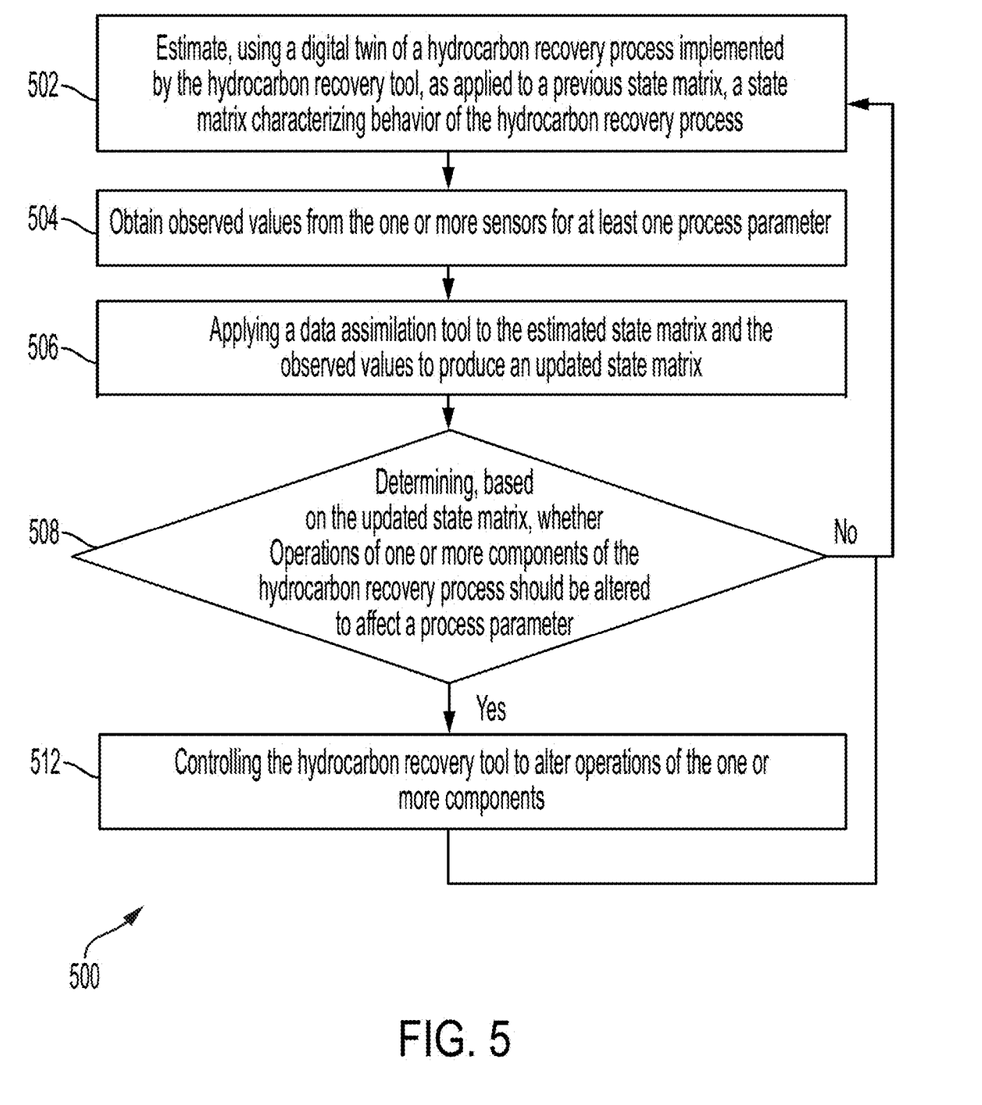
FIG. 5 is a flowchart illustrating a process by which a self-adapting twin uses sensor data to adapt according to some aspects.

FIG. 5 is a graphical representation illustrating a process 500 by which a self-adapting twin uses sensor data to adapt according to some aspects. In this example, a processing device 202 of the computing device 112 may use a generated DT to predict future behavior of a hydrocarbon recovery tool such as a well, a reservoir, a field of wells, subcomponents of a hydrocarbon recovery tool, or processes carried out by a hydrocarbon recovery tool.

In block 502, the processing device 202 may, estimate, using a DT of a hydrocarbon recovery process implemented by a hydrocarbon recovery tool, as applied to a previous state matrix, a state matrix characterizing behavior of the hydrocarbon recovery process. The previous state matrix estimate may have been generated based on "best guess" process parameters or previously obtained process parameters. If the current execution of the operations is the first execution, then the previous state matrix is generated using seed values for DT parameters and observed process parameters. The processing device 202 may apply DT 210 to the previous state matrix based on process parameters previously obtained from the sensor observing module 211, using instructions 212. These parameters may include DT parameters (e.g., predicted output) and observed process parameters for a time t−1 occurring just prior to the current time step t.

In block 504, the processing device 202 may obtain from one or more sensors, observed values for at least one process parameter. The processing device 202 may use the sensor observing module 211 and instructions 212 to obtain feedback or output from sensors deployed throughout the hydrocarbon recovery environment. These sensors may be integrated with, coupled to, in communication with, or otherwise associated with the hydrocarbon recovery tool on which the hydrocarbon recovery. Process is implemented.

Alternatively, the hydrocarbon recovery tool may have no communication with the sensors, which may communicate directly with the computing device 112. For example, some sensors may be deployed as integrated components of the hydrocarbon recovery tool. In another example, in which the hydrocarbon recovery tool is a field of wells, the sensors may be sensors of each well within the field. These sensors may communicate wirelessly with the wells within the field and/or computing deice 112. Thus, the sensor observing module 211 may receive feedback from a single nearby sensor, or may sensors distributed across a large area, depending on the DT parameters associated with the DT. Each of the observed process parameters is represented in the DT model 210.

A number of representations of the feedback or output of each sensors for the period between a previous measurement time and the current time. For example, a time step of 10 seconds and a sample rate of five samples per second, produces 50 measurements or representations of the sensor output. This output may be incorporated into a data matrix D.

In block 506, the processing device may apply a data assimilation tool to the estimated state matrix and the observed values to produce an updated state matrix. The data assimilation tool can be an EnKF correction applied, as illustrated in FIG. 3B to the estimated state matrix combining the DT parameters and the observed process parameters to produce an updated state matrix. The data assimilation tool may thus remove measurement or signal noise associated with observed measurements, from the estimated state vector to produce the updated state matrix.

In block 508, the processing device may determine based on the updated state matrix, whether operations of one or more components of the hydrocarbon recovery process should be altered to affect a process parameter. The updated state matrix can include updated estimates of the DT parameters affected by the observed process parameters. Any of the updated DT parameters may be parameters of interest to an engineer or administrator of the hydrocarbon recovery tool. The instructions 212 may compare one or more of the updated DT parameters contained within the updated state matrix to an expected value for each of the one or more updated DT parameters. In the example illustrated in FIG. 4, the updated estimate of absolute fracture production rate may be compared against a desired or expected production rate. The instructions 213 may further determine whether any discrepancy between the updated estimate of the fracture production and the expected value is within a normal or acceptable range. If the production rate is within a normal range, then the instructions 212 may determine that no change to operations is required, otherwise the instructions 212 may determine that changes to production should be implemented. For example, one or more components of the hydrocarbon recovery tool should be controlled to modify their operations to affect a change in the absolute fracture permeability.

In response to determining that the operations of one or more components of the hydrocarbon recovery process should be altered to affect the process parameter (i.e., block 508="Yes"), the processing device 202 may in block 512, control to alter operations of the one or more components. The instructions 212 may enable the processing device 202 to control or request control of components of the hydrocarbon recovery process may altering operations of the hydrocarbon recovery tool implementing the hydrocarbon recovery process.

In various aspects, the processing device 202 may determine which components should be controlled and their operations altered by reviewing the updated state matrix. If a DT parameter does not fall within a normal range of discrepancy from an expected value, then the processing device 202 may review the updated state matrix to identify whether any observed process parameters have values lying outside a normal range The computing device 112 can incrementally adjust the operations of an identified component to alter the updated estimate of a process parameter at the next time step t. For example, the processing device 202 may use instructions 211 to change a drilling bit speed to reduce temperature within a wellbore or the wellhead pressure in the case of production.

Once operations of the identified component of the DT have been altered, the processing device may return to block 502, using the updated state matrix as the previous state matrix. New sensor data may be gathered, the data assimilation tool applied, and a new updated state matrix obtained. This new updated state matrix may be evaluated in block 512 to determine whether the DT parameter is now within a normal range, or if further modification to operations of a component are needed. In some aspects, different components may be controlled in different iterations of the process 500 based on changes to the observed parameters during each iteration. In drilling, in a first iteration a drill bit speed may be adjusted based on an observed process parameter that appears to be outside of a normal range. At a second iteration, another observed process parameter may appear to be further outside a normal range than the observed process parameter associated with the drill bit, resulting in the selection of another component for control and operations modification.

In some aspects, if the DT parameter is outside of the normal range, or meets a threshold of discrepancy or differentiation from the expected value, then an alert may be generated. The processing device 202 may signal via the display device 226 that a DT parameters is outside an acceptable range and that engineer attention is recommended. Similarly, the processing deice 202 may transmit via communication interface 206 an alert message to one or more remote computing devices indicating that engineering intervention is recommended. In an example, a well within a field of wells may experience a situation in which a DT parameter lies outside of the normal range, and an edge computing device (e.g., computing device 112) may communicate to otherwells within the field that a problem has occurred. Receipt of this communication may initiate a change in operations of nearby wells to mitigate the impact of their operations on the DT parameter within the first well.

In response to determining that the operations of the one or more components of hydrocarbon recovery process should not be altered to affect output of the one or more sensors (i.e., block 508="No"), the processing device 202 may return to block 502 and continue predicting future states of the component of the process settings.

As used below, any reference to a series of examples is to be understood as a reference to each of those examples disjunctively (e.g., "Examples 1-4" is to be understood as "Examples 1, 2, 3, or 4").

Example 1: A system comprising: a hydrocarbon recovery tool; one or more sensors; and a computing device in communication with the hydrocarbon recovery tool and the one or more sensors, the computing device including a non-transitory memory device comprising instructions that are executable by the computing device to cause the computing device to perform operations comprising: estimating, using a digital twin of a hydrocarbon recovery process implemented by the hydrocarbon recovery tool, as applied to a previous state matrix, a state matrix characterizing behavior of the hydrocarbon recovery process; obtaining observed values from the one or more sensors for at least one process parameter; applying a data assimilation tool to the estimated state matrix and the observed values to produce an updated state matrix; determining, based on the updated state matrix, that operations of one or more components of the hydrocarbon recovery process should be altered to affect a process parameter; and controlling the hydrocarbon recovery tool to alter operations of the one or more components in response to determining, based on the updated state matrix that the operations of the one or more components should be altered to affect the process parameter.

Example 2: the system of example 1, wherein determining, based on the updated state matrix, whether operations of the one or more components of the hydrocarbon recovery process should be altered comprises determining, whether a value of a predicted parameter within the updated state matrix is within an acceptable range.

Example 3: the system of example 2, wherein the operations further comprise: determining whether the value of the predicted parameter meets a threshold, in response to determining that the value of the predicted parameter within the updated state matrix is within an acceptable range; and generating an alert message in response to determining that the value of the predicted parameter meets the threshold.

Example 4: the system of any of examples 1-3, wherein the hydrocarbon recovery process is a drilling process.

Example 5: the system of any of examples 1-4, wherein the hydrocarbon recovery process is a production process.

Example 6: the system of any of examples 1-5, wherein the data assimilation tool is an Ensemble Kalman Filter.

Example 7: the system of any of examples 1-6, wherein the one or more sensors are distributed in the hydrocarbon recovery process environment.

Example 8: the system of any of examples 1-7, wherein the state matrix includes estimates of one or more DT parameters and the observed values of the one or more process parameters sampled during a time step.

Example 9: A method comprising: estimating, using a digital twin of a hydrocarbon recovery process implemented by a hydrocarbon recovery tool, as applied to a previous state matrix, a state matrix characterizing behavior of the hydrocarbon recovery process; obtaining observed values from one or more sensors for at least one process parameter; applying a data assimilation tool to the estimated state matrix and the observed values to produce an updated state matrix; determining, based on the updated state matrix, that operations of one or more components of the hydrocarbon recovery process should be altered to affect a process parameter; and controlling the hydrocarbon recovery tool to alter operations of the one or more components in response to determining, based on the updated state matrix that the operations of the one or more components should be altered to affect the process parameter.

Example 10: the method of example 9, wherein determining, based on the updated stat matrix, whether operations of the one or more components of the hydrocarbon recovery process should be altered, comprises determining, whether a value of a predicted parameter within the updated state matrix is within an acceptable range.

Example 11: the method of example 10, further comprise: determining whether the value of the predicted parameter meets a threshold, in response to determining that the value of the predicted parameter within the updated state matrix is within an acceptable range; and generating an alert message in response to determining that the value of the predicted parameter meets the threshold.

Example 12: the method of any of examples 9-11, wherein the data assimilation tool is an Ensemble Kalman Filter.

Example 13: the method of any of examples 9-12, wherein the one or more sensors are distributed throughout a hydrocarbon recovery process environment.

Example 14: the method of any of examples 9-13, wherein the state matrix includes estimates of one or more DT parameters and the observed values of the one or more process parameters sampled during a time step.

Example 15: A non-transitory computer-readable medium that includes instructions that are executable by a processing device for causing the processing device to perform a method comprising: estimating, using a digital twin of a hydrocarbon recovery process implemented by a hydrocarbon recovery tool, as applied to a previous state matrix, a state matrix characterizing behavior of the hydrocarbon recovery process; obtaining observed values from one or more sensors for at least one process parameter; applying a data assimilation tool to the estimated state matrix and the observed values to produce an updated state matrix; determining, based on the updated state matrix, that operations of one or more components of the hydrocarbon recovery process should be altered to affect a process parameter; and controlling the hydrocarbon recovery tool to alter operations of the one or more components in response to determining, based on the updated state matrix that the operations of the one or more components should be altered to affect the process parameter.

Example 16: the non-transitory computer-readable medium of example 15, wherein the operations for determining, based on the updated state matrix, whether operations of the one or more components of the hydrocarbon recovery tool should be altered to affect output of the one or more sensors, comprise operations for determining, whether a value of a predicted parameter within the updated state matrix is within an acceptable range.

Example 17: the non-transitory computer-readable medium of example 16, wherein the operations further comprise: determining whether the value of the predicted parameter meets a threshold, in response to determining that the value of the predicted parameter within the updated state matrix is within an acceptable range; and generating an alert message in response to determining that the value of the predicted parameter meets the threshold.

Example 18: the non-transitory computer-readable medium of any of examples 15-17, wherein the data assimilation tool is an Ensemble Kalman Filter.

Example 19: the non-transitory computer-readable medium of any of examples 15-18, wherein the one or more sensors are distributed throughout a hydrocarbon recovery process environment.

Example 20: the non-transitory computer-readable medium of any of examples 15-19, wherein the state matrix includes estimates of one or more DT parameters and the observed values of the one or more process parameters sampled during a time step.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure.

What is claimed is:

1. A system comprising:
a hydrocarbon recovery tool located within a hydrocarbon recovery environment to implement a hydrocarbon recovery process;
one or more sensors deployed at one or more locations within the hydrocarbon recovery environment and configured to monitor process parameters of the hydrocarbon recovery process; and
a computing device in communication with the hydrocarbon recovery tool and the one or more sensors, the computing device including a non-transitory memory device comprising instructions that are executable by the computing device to cause the computing device to perform operations comprising:
estimating, using a digital twin of the hydrocarbon recovery process implemented by the hydrocarbon recovery tool, as applied to a previous state matrix, a state matrix characterizing behavior of the hydrocarbon recovery process;
predicting a covariance matrix using the function:

$$\|Ct\|i, j = \frac{\sum_{k=1}^{N_e}(Xi, k - \overline{X}i)(Xj, k - \overline{X}j)}{N_e - 1}$$

where i and j represent the row and column indices of the matrix, Xi, k represents the k-th realization of the i-th process parameter of the matrix, $\overline{X}i$ represents the i-th row mean, Xj, k represents the k-th realization of the j-th process parameter of the matrix, $\overline{X}j$ represents the j-th column mean, and $N_e$ represents the total number of realizations;

obtaining observed values from the one or more sensors for at least one of the process parameters of the hydrocarbon recovery process;

generating a data assimilation tool based on the covariance matrix and a data error value;

applying the data assimilation tool to the estimated state matrix and the observed values to produce an updated state matrix including a predicted future value of the at least one of the process parameters based on the observed values, wherein producing the updated state matrix occurs at non-equidistant time intervals (steps) and includes:

determining a future state vector in a forecast step using the function:

$$X_t^f = M(X_{t-1}{}^u) + \omega_M$$

where M is a digital twin simulation function, $X_{x-1}{}^u$ represents the state matrix at the time step prior to the current time step t, and $\omega_M$ represents model error; and performing an update step to determine an updated state vector using the function:

$$X_t^u = X_t^f + G_t \cdot (D_t - H_t \cdot X_t^f)$$

where $X_t^f$ is the previously determined future state vector, $G_t$ represents filter function gain, $D_t$ is a data matrix containing updated digital twin parameter data, and $H_t$ is an observation matrix containing process parameter data, and where the filter function gain is Kalman filter gain determined using the function:

$$G_t = C_t \cdot H_t^T \cdot (H_t \cdot C_t \cdot H_t^T + \varepsilon)^{-1}$$

where $C_t$ is the previously determined covariance matrix, $H_t$ is the observation matrix, $H_t^T$ is the observation matrix after transposition, and $\varepsilon$ represents a data error value;

determining that the predicted future value of the at least one of the process parameters in the updated state matrix is not within a range of acceptable values; and in response, optimizing the hydrocarbon recovery process by controlling one or more components of the hydrocarbon recovery tool that affect the at least one of the process parameters to increase or decrease the observed values of the at least one of the process parameters as needed to bring a subsequent predicted future value of the at least one of the process parameters within the range of acceptable values.

2. The system of claim 1, wherein:
the hydrocarbon recovery tool is selected from the group consisting of a well, a field of wells, a drilling apparatus, and a production apparatus; and
the observed values are selected from the group consisting of flow rate within a reservoir, wellbore or fracture, temperature within a reservoir, wellbore or fracture, pressure within a reservoir, wellbore or fracture, input pH, pump output, pump motor voltage, pump motor current, pump motor frequency, permeability values, chemical values, hydrocarbon recovery environment geometry values, and combinations thereof.

3. The system of claim 1, wherein the operations further comprise:
determining that the predicted future value of the at least one of the process parameters is outside the range of acceptable values and also exceeds a threshold value; and
in response to determining that the predicted future value of the at least one of the process parameters exceeds the threshold value, generating an alert indicating the possibility of a catastrophic failure.

4. The system of claim 1, wherein the hydrocarbon recovery process is a drilling process.

5. The system of claim 1, wherein the hydrocarbon recovery process is a production process.

6. The system of claim 1, wherein the data assimilation tool is further generated based on an observation matrix, wherein the data assimilation tool is an Ensemble Kalman Filter, and wherein the covariance matrix includes covariance values between pairs of elements in the state matrix.

7. The system of claim 1, wherein the one or more sensors are distributed in the hydrocarbon recovery environment.

8. The system of claim 1, wherein the state matrix includes estimates of one or more digital twin parameters and the observed values of the one or more process parameters sampled during a time step.

9. A method comprising:
implementing a hydrocarbon recovery process by operating a hydrocarbon recovery tool located within a hydrocarbon recovery environment;
monitoring process parameters of the hydrocarbon recovery process using one or more sensors deployed at one or more locations within the hydrocarbon recovery environment;
estimating, by a processing device, using a digital twin of the hydrocarbon recovery process implemented by the hydrocarbon recovery tool, as applied to a previous state matrix, a state matrix characterizing behavior of the hydrocarbon recovery process;
predicting, by the processing device, a covariance matrix using the function:

$$\|Ct\|i, j = \frac{\sum_{k=1}^{N_e}(Xi, k - \overline{X}i)(Xj, k - \overline{X}j)}{N_e - 1}$$

where i and j represent the row and column indices of the matrix, Xi, k represents the k-th realization of the i-th process parameter of the matrix, $\overline{X}i$ represents the i-th row mean, Xj, k represents the k-th realization of the j-th process parameter of the matrix, $\overline{X}j$ represents the j-th column mean, and $N_e$ represents the total number of realizations;

obtaining, by the processing device, observed values from the one or more sensors for at least one of the process parameters of the hydrocarbon recovery process;

generating, by the processing device, a data assimilation tool based on the covariance matrix and a data error value;

applying, by the processing device, the data assimilation tool to the estimated state matrix and the observed values to produce an updated state matrix including a predicted future value of the at least one of the process parameters based on the observed values, wherein producing the updated state matrix occurs at non-equidistant time intervals (steps) and includes:
determining a future state vector in a forecast step using the function:

$$X_t^f = M(X_{t-1}^u) + \omega_M$$

where M is a digital twin simulation function, $X_{t-1}^u$ represents the state matrix at the time step prior to the current time step t, and $\omega_M$ represents model error; and performing an update step to determine an updated state vector using the function:

$$X_t^u = X_t^f + G_t \cdot (D_t - H_t \cdot X_t^f)$$

where $X_t^f$ is the previously determined future state vector, $G_t$ represents filter function gain, $D_t$ is a data matrix containing updated digital twin parameter data, and $H_t$ is an observation matrix containing process parameter data, and where the filter function gain is Kalman filter gain determined using the function:

$$G_t = C_t \cdot H_t^T \cdot (H_t \cdot C_t \cdot H_t^T + \varepsilon)^{-1}$$

where $C_t$ is the previously determined covariance matrix, $H_t$ is the observation matrix, $H_t^T$ is the observation matrix after transposition, and $\varepsilon$ represents a data error value;

determining, by the processing device, that the predicted future value of the at least one of the process parameters in the updated state matrix is not within a range of acceptable values; and in response, optimizing the hydrocarbon recovery process by controlling one or more components of the hydrocarbon recovery tool that affect the at least one of the process parameters to increase or decrease the observed values of the at least one of the process parameters as needed to bring a subsequent predicted future value of the at least one of the process parameters within the range of acceptable values.

10. The method of claim 9, wherein:
the hydrocarbon recovery tool is selected from the group consisting of a well, a field of wells, a drilling apparatus, and a production apparatus; and
the observed values are selected from the group consisting of flow rate within a reservoir, wellbore or fracture, temperature within a reservoir, wellbore or fracture, pressure within a reservoir, wellbore or fracture, input pH, pump output, pump motor voltage, pump motor current, pump motor frequency, permeability values, chemical values, hydrocarbon recovery environment geometry values, and combinations thereof.

11. The method of claim 9, further comprising:
determining that the predicted future value of the at least one of the process parameters is outside the range of acceptable values and also exceeds a threshold value; and in response to determining that the predicted future value of the at least one of the process parameters exceeds the threshold value, generating an alert indicating the possibility of a catastrophic failure.

12. The method of claim 9, wherein the data assimilation tool is further generated based on an observation matrix, wherein the data assimilation tool is an Ensemble Kalman Filter, and wherein the covariance matrix includes covariance values between pairs of elements in the state matrix.

13. The method of claim 9, wherein the one or more sensors are distributed throughout the hydrocarbon recovery environment.

14. The method of claim 9, wherein the state matrix includes estimates of one or more digital twin parameters and the observed values of the one or more process parameters sampled during a time step.

15. A non-transitory computer-readable medium that includes instructions that are executable by a processing device for causing the processing device to perform operations comprising:
estimating, using a digital twin of a hydrocarbon recovery process implemented by a hydrocarbon recovery tool located within a hydrocarbon recovery environment, as applied to a previous state matrix, a state matrix characterizing behavior of the hydrocarbon recovery process;
predicting a covariance matrix using the function:

$$\|Ct\|i, j = \frac{\sum_{k=1}^{N_e}(Xi, k - \overline{X}i)(Xj, k - \overline{X}j)}{N_e - 1}$$

where i and j represent the row and column indices of the matrix, Xi, k represents the k-th realization of the i-th process parameter of the matrix, $\overline{X}i$ represents the i-th row mean, Xj, k represents the k-th realization of the j-th process parameter of the matrix, $\overline{X}j$ represents the j-th column mean, and $N_e$ represents the total number of realizations;

obtaining, from one or more sensors deployed at one or more locations within the hydrocarbon recovery environment and configured to monitor process parameters of the hydrocarbon recovery process, observed values for at least one process parameter;

generating a data assimilation tool based on the covariance matrix and a data error value;

applying the data assimilation tool to the estimated state matrix and the observed values to produce an updated state matrix including a predicted future value of the at least one of the process parameters based on the observed values, wherein producing the updated state matrix occurs at non-equidistant time intervals (steps) and includes:
determining a future state vector in a forecast step using the function:

$$X_t^f = M(X_{t-1}^u) + \omega_M$$

where M is a digital twin simulation function, $X_{t-1}^u$ represents the state matrix at the time step prior to the current time step t, and $\omega_M$ represents model error; and performing an update step to determine an updated state vector using the function:

$$X_t^u = X_t^f + G_t \cdot (D_t - H_t \cdot X_t^f)$$

where $X_t^f$ is the previously determined future state vector, $G_t$ represents filter function gain, $D_t$ is a data matrix containing updated digital twin parameter data, and $H_t$ is an observation matrix containing process parameter data, and where the filter function gain is Kalman filter gain determined using the function:

$$G_t = C_t \cdot H_t^T \cdot (H_t \cdot C_t \cdot H_t^T + \varepsilon)^{-1}$$

where $C_t$ is the previously determined covariance matrix, $H_t$ is the observation matrix, $H_t^T$ is the observation matrix after transposition, and $\varepsilon$ represents a data error value:

determining that the predicted future value of the at least one of the process parameters in the updated state matrix is not within a range of acceptable values; and in response, optimizing the hydrocarbon recovery process by controlling one or more components of the hydrocarbon recovery tool that affect the at least one of the process parameters to increase or decrease the observed values of the at least one of the process parameters as needed to bring a subsequent predicted future value of the at least one of the process parameters within the range of acceptable values.

16. The non-transitory computer-readable medium of claim 15, wherein:

the hydrocarbon recovery tool is selected from the group consisting of a well, a field of wells, a drilling apparatus, and a production apparatus; and the observed values are selected from the group consisting of flow rate within a reservoir, wellbore or fracture, temperature within a reservoir, wellbore or fracture, pressure within a reservoir, wellbore or fracture, input pH, pump output, pump motor voltage, pump motor current, pump motor frequency, permeability values, chemical values, hydrocarbon recovery environment geometry values, and combinations thereof.

17. The non-transitory computer-readable medium of claim 15, wherein the operations further comprise:

determining that the predicted future value of the at least one of the process parameters is outside the range of acceptable values and also exceeds a threshold value; and in response to determining that the predicted future value of the at least one of the process parameters exceeds the threshold value, generating an alert indicating the possibility of a catastrophic failure.

18. The non-transitory computer-readable medium of claim 15, wherein the data assimilation tool is further generated based on an observation matrix, wherein the data assimilation tool is an Ensemble Kalman Filter, and wherein the covariance matrix includes covariance values between pairs of elements in the state matrix.

19. The non-transitory computer-readable medium of claim 15, wherein the one or more sensors are distributed throughout the hydrocarbon recovery environment.

20. The non-transitory computer-readable medium of claim 15, wherein the state matrix includes estimates of one or more digital twin parameters and the observed values of the one or more process parameters sampled during a time step.

* * * * *